(12) United States Patent
Yen et al.

(10) Patent No.: US 6,979,983 B2
(45) Date of Patent: Dec. 27, 2005

(54) VOLTAGE REGULATOR

(75) Inventors: Wen-Cheng Yen, Taichung (TW); Cheng-Chung Chou, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 10 days.

(21) Appl. No.: 10/833,914

(22) Filed: Apr. 28, 2004

(65) Prior Publication Data

US 2005/0242794 A1    Nov. 3, 2005

(51) Int. Cl.[7] ............................................. G05F 1/44
(52) U.S. Cl. ..................................... 323/274; 327/541
(58) Field of Search ........................... 323/268, 269, 323/273, 274, 275; 327/540, 541

(56) References Cited

U.S. PATENT DOCUMENTS 5,973,484 A * 10/1999 Cho ............................ 323/269
6,727,680 B2 * 4/2004 Hoffman ..................... 323/269

* cited by examiner

*Primary Examiner*—Gary L Laxton
(74) *Attorney, Agent, or Firm*—Winston Hsu

(57) ABSTRACT

A voltage regulator, regulating a supply voltage and outputting a regulated voltage. The voltage regulator comprises a two stage OP which outputs a first voltage and a second voltage according to a reference voltage and a feedback voltage. A NMOS transistor controlled by a voltage detection unit, to receive the second voltage when the detected supply voltage is in a high mode. A PMOS transistor controlled by the voltage detection unit, to receive the first voltage when the detected supply voltage is in a low mode. A feedback circuit for receiving the regulated voltage and outputting the feedback voltage to the two stage OP.

5 Claims, 4 Drawing Sheets

VOLTAGE REGULATOR

BACKGROUND OF THE INVENTION

1. Field of the Invention

The present invention relates to a voltage regulator, and ore particularly, to a dual mode voltage regulator.

2. Description of the Related Art

Generally, for stabilizing the voltage output to an internal circuit supplied by a supply voltage, a voltage regulator is set between a supply voltage and a load.

FIG. 1 is a schematic circuit diagram showing a related circuit structure of a voltage regulator 1. The voltage regulator 1 has an OP 10 and a NMOS transistor 11. The disadvantage of the voltage regulator 1 with NMOS transistor 11 is that it requires a high supply voltage $V_{DD}$. Another configuration of a voltage regulator 1' is shown in FIG. 2. The voltage regulator 1' has an OP 10 and a PMOS transistor 11'. Though it can be operated in low supply voltage $V_{DD}$, the voltage regulator 1' has stability problems and worse transient response. A large external compensation capacitor must be disposed at the output to determine start up delay time.

When the regulator in Multi-Media Card applications, the regulator must be operated under dual voltage (e.g. 3.3 V and 1.8 V). Thus, it is more difficult to stabilize the supply voltage without use of an external capacitor.

SUMMARY OF THE INVENTION

Accordingly, an object of the present invention is to provide a voltage regulator, cable of providing stable voltage in various supply voltages.

In order to achieve the above object, the invention provides an voltage regulator, to regulate a supply voltage and output a regulated voltage. The voltage regulator comprises a two stage OP, a voltage detection unit, a first regulating unit, a second regulating unit, and a feedback circuit. Wherein a reference voltage and a feedback voltage are applied to the two stage OP to output a first voltage and a second voltage. When the feedback voltage is raised, the first voltage is raised, and the second voltage is lowered. The voltage detecting unit directs the first regulating unit to receive the second voltage and output the regulated voltage when the detected supply voltage is in a high mode. When the second voltage is lowered, the regulated voltage is also lowered. The voltage detecting unit directs the second regulating unit to receive the first voltage and output the regulated voltage when the detected supply voltage is in a low mode. When the first voltage is raised, the regulated voltage is lowered. The feedback circuit is coupled to the output of the regulated circuit to receive the regulated voltage and output the feedback voltage.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 2:
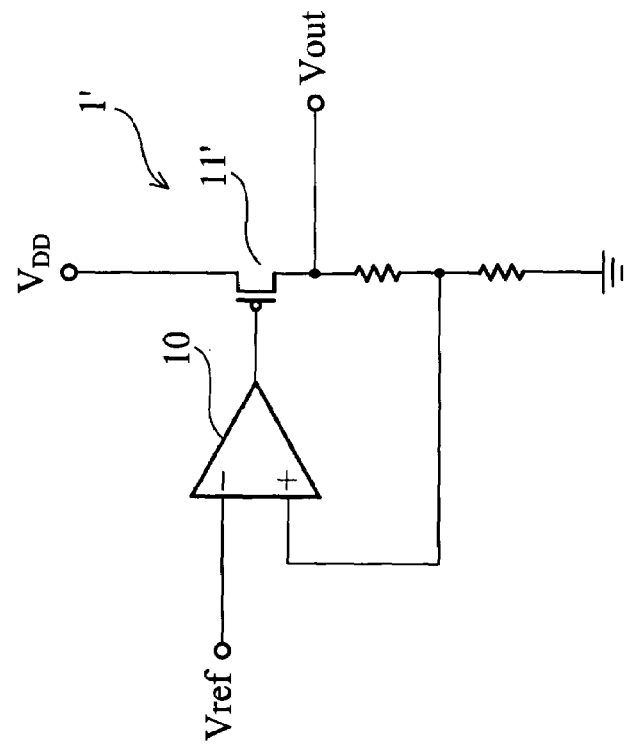
FIG. 2 is a schematic diagram showing another conventional regulator.
Figure 1:
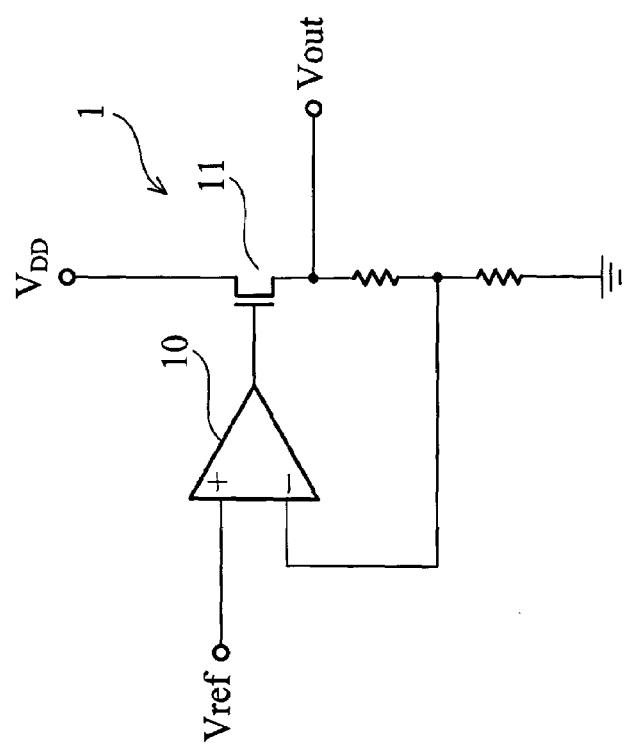
FIG. 1 is a schematic circuit diagram showing a conventional regulator.
Figure 3:
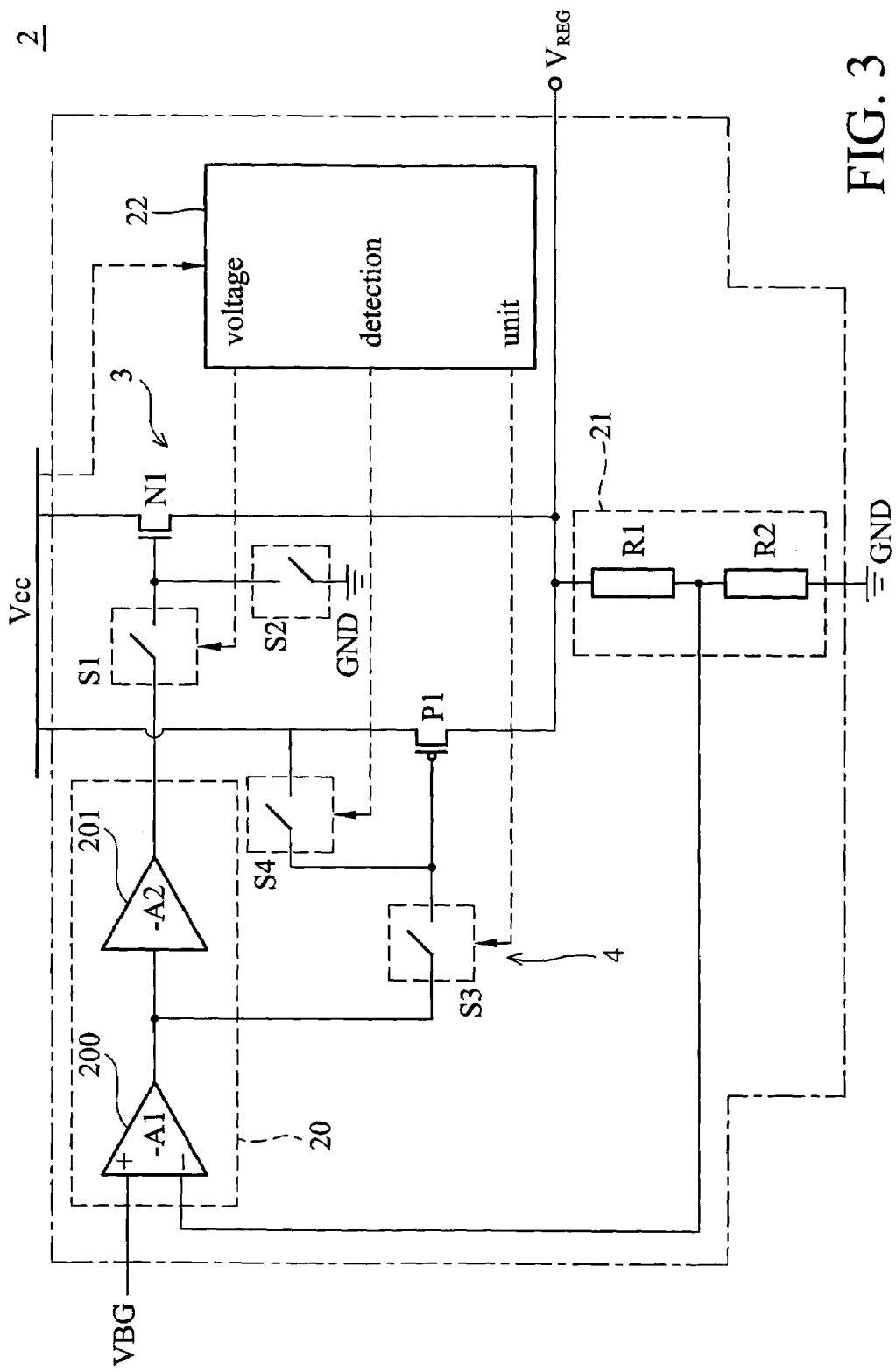
FIG. 3 is a schematic circuit in accordance with the present invention.

FIG. 3 is a schematic circuit diagram according to an embodiment of the invention.

The voltage regulator 2 receives a supply voltage $V_{CC}$ and outputs a regulated voltage $V_{REG}$, the voltage regulator 2 includes a two stage OP 20, a first regulating unit 3, a second regulating unit 4, a feedback circuit 21 and a voltage detection unit 22.

The two stage amplifier 20 has a first stage amplifier 200 with a gain=−A1 and a second stage amplifier 201 with a gain=−A2, wherein the first stage amplifier 200 has a non-inverting terminal to receive a reference voltage VBG, an inverting terminal to receive a feedback voltage, and an output terminal to output the first voltage. The second stage amplifier 201 is coupled to the output terminal of the first stage amplifier 200, to output a second voltage which has an inverse polarity to the first voltage.

The first regulating unit 3 includes a NMOS transistor N1, a first switch S1 and a second switch S2. The NMOS transistor N1 comprises a drain terminal coupled to the supply voltage Vcc, a gate terminal coupled to the output of the second stage amplifier 201 through the first switch S1 and to a ground GND through the second switch S2. A source terminal of the NMOS transistor N1 is coupled to an output of the voltage regulator 2.

The second regulating unit 4 includes a PMOS transistor P1, a third switch S3 and a fourth switch S4. The PMOS transistor P1 comprises a source terminal coupled to the supply voltage Vcc, a gate terminal coupled to the output of the first stage amplifier 200 through the third switch S3 and the source terminal through the fourth switch S4. A drain terminal of the PMOS P1 is coupled to the output of the voltage regulator.

The feedback circuit 21 has a first resistor R1 and a second resistor R2. The first resistor R1 comprises a first terminal for receiving the regulated voltage VREG, a second terminal for outputting the feedback voltage. The second resistor R2 has a first terminal coupling to the second terminal of the first resistor R1, and a second terminal coupling to a ground GND.

The voltage detection unit 22 is a multi-value voltage power on reset (POR) or a voltage detector (VDT). The voltage detecting unit 22 is coupled to the supply voltage $V_{cc}$ to detect the supply voltage $V_{CC}$, and control the on/off of the four switches S1~S4.

Figure 4:
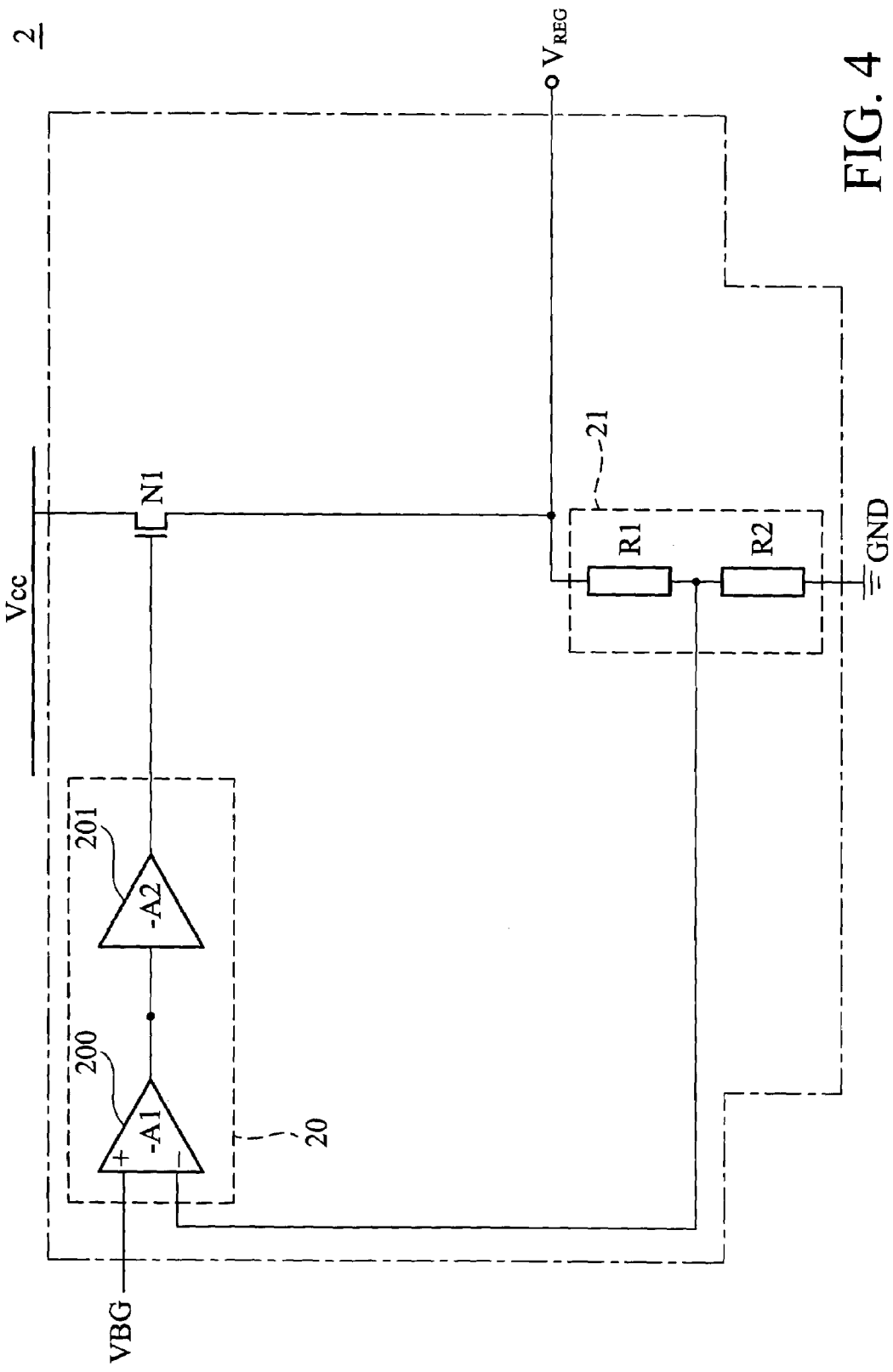
FIG. 4 is a schematic circuit of the regulated circuit operating in a high mode.

Referring again to FIG. 3, When the voltage detection unit 22 detects the supply voltage $V_{CC}$ in a high mode (ex:3.3V), the switches S1 and S4 are turned on by the voltage detection unit 22. NMOS N1 is turned on and the PMOS P1 is turned off. The voltage regulator 2 is operated in NMOS output stage as shown in FIG. 4. During operation, for example, if the regulator voltage $V_{REG}$ is pulled low in a short time, the feedback voltage is lowered, the first voltage is lowered and the second voltage applied to the gate terminal of NMOS N1 is raised. As is known in the art, an NMOS transistor acts as a source follower if its gate acts as input and its source acts as output. Furthermore, the voltage at the output of a source follower will "follow" the voltage at the input of the source follower. Hence, the source terminal of NMOS transistor N1 is raised and the regulated voltage $V_{REG}$ at the output of the regulator 2 is also raised (pulled high) until the regulated voltage $V_{REG}$ is approximately equal to the reference voltage $V_{BG}$.

Figure 5:
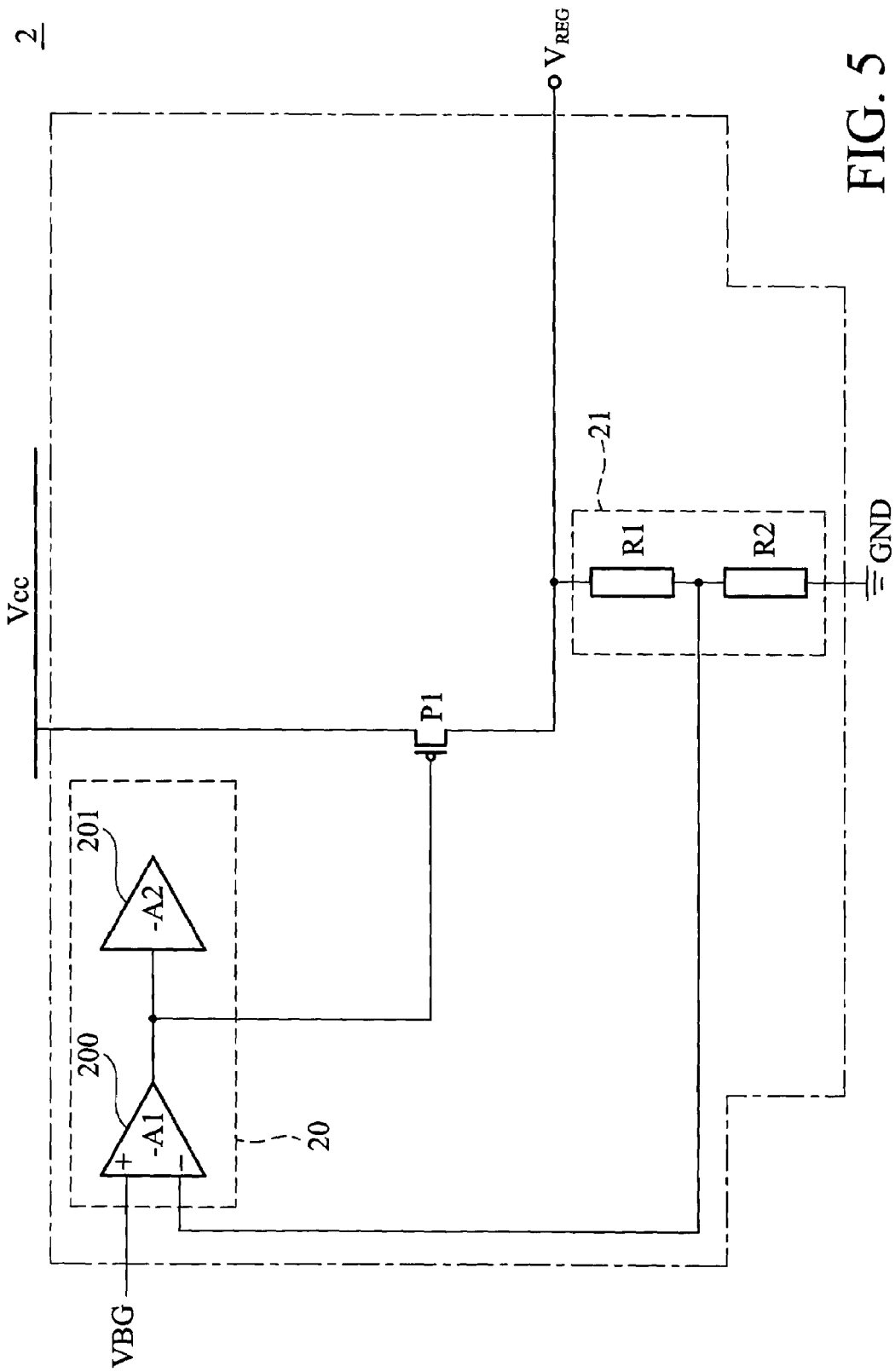
FIG. 5 is a schematic circuit of the regulated circuit operating in a low mode.

Referring again to FIG. 3, When the voltage detection unit 22 detects the supply voltage $V_{CC}$ in a low mode (ex:1.8 V), the switches S2 and S3 are turned on by the voltage detection unit 22. NMOS N1 is turned off and the PMOS P1 is turned on. The voltage regulator 2 is operated in PMOS P1 output stage as illustrated in FIG. 5. During operation, for example, if the regulator voltage $V_{REG}$ is pulled low in a short time, the feedback voltage is lowered; and the first voltage applied to the gate terminal of PMOS P1 is also lowered. Current passing through source-drain terminal of PMOS transistor P1 is increased and the regulated voltage $V_{REG}$ at the output of the regulator 2 is also raised (pulled high) until the regulated voltage $V_{REG}$ is approximately equal to the reference voltage $V_{BG}$.

The present invention offers enhanced output performance in comparison with the related art. The voltage regulator is directed to operate in an NMOS mode or in a PMOS mode by the voltage detection unit detecting the voltage type. The regulator with PMOS output stage is bettered suited than a regulator with NMOS output stage in low mode power supply voltage. Regulators with NMOS output stage, however, provide higher driving speed than a regulator that with PMOS output stage in high mode power supply voltage. The proposed dual mode regulator can provide a nearly stable output voltage in power supplies with various voltages.

While the invention has been described by way of example and in terms of the preferred embodiment, it is to be understood that the invention is not limited to the disclosed embodiments and the protection component is mot limited to the NMOS transistor. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A voltage regulator, to regulate a supply voltage and output a regulated voltage, the voltage regulator comprises:
   a two stage OP, wherein a first voltage and a second voltage are output according to a reference voltage and a feedback voltage, when the feedback voltage is raised, the first voltage is raised, and the second voltage is decreased;
   a voltage detection unit for detecting the supply voltage;
   a first regulating unit controlled by the voltage detection unit, receiving the second voltage and operated for outputting the regulated voltage when the detected supply voltage is in a high mode, when the second voltage is lowered, the regulated voltage is also lowered; and
   a second regulating unit controlled by the voltage detection unit, receiving the first voltage and outputting the regulated voltage when the detected supply voltage is in a low mode, the first voltage is raised, the regulated voltage is lowered; and
   a feedback circuit, receiving the regulated voltage for outputting the feedback voltage.

2. The voltage regulator of claim 1, wherein the two stage OP comprises:
   a first stage amplifier, having a non-inverting terminal to receive the reference voltage, an inverting terminal to receive the feedback voltage, and an output terminal to output the first voltage;
   a second stage amplifier, coupled to the output terminal of the first stage amplifier, to output the second voltage which has a inverse polarity to the first voltage.

3. The voltage regulator of claim 2, wherein the first regulating unit comprises:
   a first switch;
   a second switch;
   an NMOS transistor comprising;
   a drain terminal coupled to the supply voltage;
   a gate terminal coupled to an output terminal of the second stage amplifier through the first switch and to a ground through the second switch;
   a source terminal coupled to an output of the voltage regulator; and
   the first switch is turned on and the second switch is turned off by the voltage detecting unit when the detected supply voltage is in the high mode, the first switch is turned off and the second switch is turned on by the voltage detecting unit when the detected supply voltage is in the low mode.

4. The voltage regulator of claim 2, wherein the second regulating unit comprises:
   a third switch;
   a fourth switch;
   a PMOS transistor comprising:
   a source terminal coupled to the supply voltage;
   a gate terminal coupled to the output of the first stage amplifier through a third switch and the source terminal through a fourth switch; and
   a drain terminal coupled to the output of the voltage regulator; and
   the third switch is turned on and the fourth switch is turned off by the voltage detection unit when the detected supply voltage is in the low mode, the third switch is turned off and the fourth switch is turned on by the voltage detection unit when the detected supply voltage is in the high mode.

5. The voltage regulator of claim 1, wherein the feedback circuit comprises:
   a first resistor, having a first terminal to receive the regulated voltage, a second terminal for outputting the feedback voltage; and
   a second resistor, having a first terminal coupled to the second terminal of the first resister, a second terminal coupled to a ground.

* * * * *